US012719396B2

(12) United States Patent
Bucksch et al.

(10) Patent No.: US 12,719,396 B2
(45) Date of Patent: Aug. 25, 2026

(54) SHUNTLESS MOTOR CONTROL FOR MULTI-PHASE MOTORS

(71) Applicant: Infineon Technologies AG, Neubiberg (DE)

(72) Inventors: Thorsten Bucksch, Munich (DE); Aneel Veerwani, Munich (DE); Chintu Seth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 174 days.

(21) Appl. No.: 18/614,128

(22) Filed: Mar. 22, 2024

(65) Prior Publication Data

US 2025/0300585 A1 Sep. 25, 2025

(51) Int. Cl.

*H02P 23/14* (2006.01)
*G01R 25/00* (2006.01)
*H02P 27/08* (2006.01)

(52) U.S. Cl.

CPC .............. *H02P 23/14* (2013.01); *G01R 25/00* (2013.01); *H02P 27/08* (2013.01)

(58) Field of Classification Search

CPC .......... H02P 23/14; H02P 27/08; H02P 29/68; G01R 25/00

USPC ................................. 324/76.77, 76.52, 76.11

See application file for complete search history.

(56) References Cited

U.S. PATENT DOCUMENTS 11,223,317 B2 * 1/2022 Yoo ........................ H02P 27/085
11,650,231 B2 * 5/2023 Zhao .................. G01R 19/0023 324/76.11
12,184,206 B2 * 12/2024 Kitagawa ................ H02P 21/18
12,301,071 B2 * 5/2025 Hara ........................ H02M 1/12
2020/0350845 A1 * 11/2020 Sinervo .................... H02P 23/24
2024/0204707 A1 * 6/2024 Frappé ..................... H02P 21/22

OTHER PUBLICATIONS

"G6K Surface Mounting Relay", Retrieved from: https://asset.conrad.com/media10/add/160267/c1/-/en/002593900DS00/datenblatt-2593900-omron-g6k-2p-y-dc12-printrelais-12-vdc-1-a-2-wechsler-1-st-bag.pdf, Accessed on: Sep. 21, 2023, 10 pp.
U.S. Appl. No. 18/392,189, filed Dec. 21, 2023, naming inventors Bucksch et al.

* cited by examiner

*Primary Examiner* — Giovanni Astacio-Oquendo
(74) *Attorney, Agent, or Firm* — Shumaker & Sieffert, P.A.

(57) ABSTRACT

Techniques and circuits for controlling a multi-phase electric motor and measuring current through the multi-phase electric motor without using a shunt resistor are described herein. A method may comprise controlling power switches of an inverter circuit to deliver a first phase current, a second phase current, and a third phase current to a multi-phase electric motor, and determining at least one of the first phase current, the second phase current, and the third phase current based on a first voltage drop over one of the power switches in a conducting mode and based on a temperature measurement, wherein the temperature measurement is based on a second voltage drop over a body diode of one of the power switches in a nonconducting mode during a dead time.

21 Claims, 7 Drawing Sheets

202
VDH
206
210
M1
NMOS
0
M3
NMOS
0
M5
NMOS
0
IL1
L1
514
IL2
L2
516
IL3
L3
518
204
208
212
520
M2
NMOS
1
M4
NMOS
1
M6
NMOS
0

SHUNTLESS MOTOR CONTROL FOR MULTI-PHASE MOTORS

TECHNICAL FIELD

This disclosure relates to multi-phase motor control and more specifically, techniques for measuring current through a multi-phase electric motor without using a shunt resistor.

BACKGROUND

Power switches are used in a wide variety of applications in order to control power being delivered to a load, such as a multi-phase electric motor. As examples, a power switch may comprise a Field Effect Transistor (FET), an insulated gate bipolar transistor (IGBT), a bipolar junction transistor (BJT), or another type of power transistor. Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials.

Power switches are typically controlled by a driver circuit via a pulse modulation (PM) signals. PM signals generally refer to pulse width modulation (PWM) signals, pulse frequency modulation (PFM) signals, pulse duration modulation signals, pulse density modulation signals, or another type of modulated control signal used to control a power switch. PM control signals may be generated by a processor and communicated to a driver circuit. The driver circuit may amplify the PM control signals to generate PM drive signals, which can be applied to the gate of a power switch so as to control on/off switching of the power switch, and thereby control the average amount of power delivered through the power switch to a load. The on/off switching of the power switch effectively chops its power delivery up into discrete parts. The average value of voltage and/or current fed to a load can be controlled by turning the switch ON and OFF at a fast rate. The longer the switch is on compared to the off periods, the higher the total power supplied to the load.

In many applications, two different power switches are configured in a high-side and low-side configuration, and the ON-OFF switching of the two power switches is synchronized in order to deliver the desired power to a switch node positioned between the high-side and low-side switch. Three-phase inverter circuits, for example, may comprise three different half bridge circuits, which each include a high-side and a low-side power switch, for controlling three different phase currents for a multi-phase electric motor.

It is often desirable or necessary to monitor current through an electric motor, e.g., as part of a regulation loop for controlling the electric motor. For such current monitoring, a shunt resistor is typically used. The shunt resistor is commonly connected to the half-bridge circuits, e.g., between the low-side switches and ground. Shunt resistors for measuring current are relatively expensive components, and the use of shunt resistors for current measuring purposes in motor control can create challenges and limitations for layout of other circuit components.

SUMMARY

This disclosure describes methods and techniques for measuring current through a multi-phase electric motor without using a shunt resistor. The techniques may use specific measurements at specific times for different voltage drop measurements over a power switch, e.g., when it is known that all motor current is flowing through a particular power switch or when it is known that all phase current is flowing over a body diode of the power switch. The techniques may also leverage the body diode of a power switch to enable a temperature measurement associated with that power switch. Moreover, the techniques may use an iterative process for calculating current through the electric motor based on a first voltage drop measurement during a conducting mode of the power switch and based on a second voltage drop measurement (i.e., the temperature measurement) during a nonconducting mode of the power switch. According to this disclosure, the timing of such measurements and the iterative calculation process may facilitate the ability to determine current through the electric motor without using any shunt resistor.

In some examples, this disclosure describes a method that comprises controlling power switches of an inverter circuit to deliver a first phase current, a second phase current, and a third phase current to a multi-phase electric motor, and determining at least one of the first phase current, the second phase current, and the third phase current based on a first voltage drop over one of the power switches in a conducting mode and based on a temperature measurement, wherein the temperature measurement is based on a second voltage drop over a body diode of one of the power switches in a nonconducting mode during a dead time.

In some examples, this disclosure describes a processor configured to: output pulse modulation (PM) signals to control power switches of an inverter circuit to deliver a first phase current, a second phase current, and a third phase current to a multi-phase electric motor; and determine at least one of the first phase current, the second phase current, and the third phase current based on a first voltage drop over one of the power switches in a conducting mode and based on a temperature measurement, wherein the temperature measurement is based on a second voltage drop over a body diode of one of the power switches in a nonconducting mode during a dead time.

In some examples, this disclosure describes a system comprising: a three-phase electric motor; a three-phase inverter circuit comprising power switches configured to control the electric motor; and a processor. The power switches may comprise: a first high-side power switch and a first low-side power switch configured to define the first phase current, a second high-side power switch and a second low-side power switch configured to define the second phase current, and a third high-side power switch and a third low-side power switch configured to define the third phase current. The processor may be configured to output PM signals to control the power switches, wherein the processor is configured to determine at least one of the first phase current, the second phase current, and the third phase current based on a first voltage drop over a first one of the power switches in a conducting mode and based on a temperature measurement, wherein the temperature measurement is based on a second voltage drop over a body diode of the first one of the power switches in a nonconducting mode during a dead time.

Details of these and other examples are set forth in the accompanying drawings and the description below. Other features, objects, and advantages will be apparent from the description and drawings, and from the claims.

DETAILED DESCRIPTION

Figure 1:
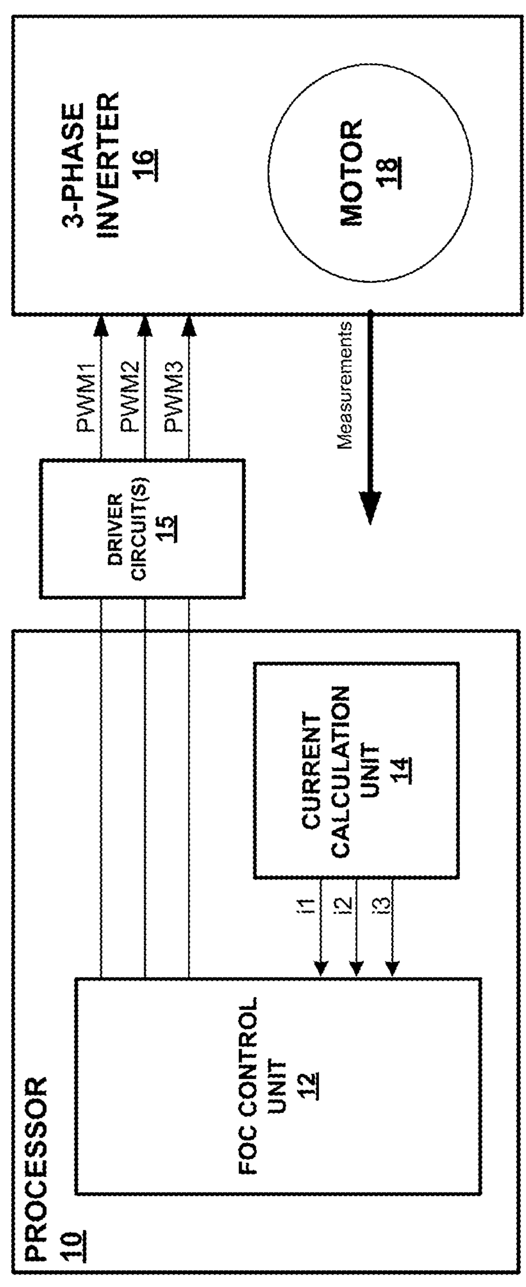
FIG. 1 is a block diagram of a system configured to control a multi-phase electric motor consistent with this disclosure.

This disclosure describes techniques for measuring current through a multi-phase electric motor without using a shunt resistor. The techniques may be implemented by a processor and may use specific measurements at specific times for different voltage drop measurements over one or more of the power switches used for the motor control (e.g., one or more of the power switches in a three-phase electric inverter circuit). A first voltage drop measurement can be made when it is known that all motor current is flowing through a particular power switch. A second voltage drop measurement can be made when it is known that all "free-wheeling" phase current is flowing over a body diode of that power switch. The second voltage drop measurement may comprise a temperature measurement associated with the power switch. With these two measurements and three equations, the techniques of this disclosure may use an iterative process for calculating current through the electric motor.

In some aspects, this disclosure can enable the ability to eliminate the need for any shunt resistor in multi-phase motor control applications, such as vector control applications or so-called field-oriented control (FOC) applications. FOC is a variable-frequency drive control method in which stator currents of a three phase AC motor are identified as two orthogonal components that can be represented by a vector. The inputs to FOC may comprise current measurements for the different phases of the electoral motor, which conventionally, are determined via one or more shunt resistors. The techniques of this disclosure can utilize the processor to generate the inputs to the FOC. In this case, the processor can be configured to perform the techniques of this disclosure in order to determine the different phase currents without using any shunt resistor.

In some examples, the techniques of this disclosure may leverage known operational relationships (e.g., the switching cycles) among the different power switches in a three-phase inverter circuit, and the techniques may also use known relationships between power switch junction temperatures, power switch resistance, and current through a given power switch. The techniques may utilize an iterative process for determining current through a particular power switch, which may be based on an initial assumption and based on iterative calculations that refine that assumption as the process iterates. In some examples, each iteration of the iterative process may correspond to a pulse modulation control cycle associated with the power switches, which can simplify the process of identifying the final result. A level of current through the electric motor may be determined after a defined number of iterations of the iterative process.

Other presumptions may also be used to improve or accelerate the process. For example, as an additional feature, according to this disclosure, an initial current estimate used in the iterative process of determining current may correspond to a previous current calculation in a previous iterative process. This type of initial current estimate may help to reduce the number of iterations needed to determine current via the iterative process.

FIG. 1 is a block diagram of a system configured to control a multi-phase electric motor 18 consistent with this disclosure. Electric motor 18 may comprise a three-phase electric motor that is controlled by a three-phase inverter circuit 16. Three-phase inverter circuit 16 comprises a plurality of power switches configured to deliver the phase currents to electric motor 18. For example, three-phase inverter circuit 16 may comprise a first high-side power switch and a first low-side power switch configured to define a first phase current for a first phase of electric motor 18, a second high-side power switch and a second low-side power switch configured to define a second phase current for a second phase of electric motor 18, and a third high-side power switch and a third low-side power switch configured to define the third phase current for a third phase of electric motor 18. FOC control unit 12 of processor 10 may be configured to generate pulse modulation (PM) control signals, such as pulse width modulation (PWM) control signals to one or more driver circuit(s) 15. Driver circuit(s) 15 may amplify the PWM control signals to generate PWM drive signals, which can be applied to the gates of power switches of inverter circuit 16 to control on/off switching of the power switches.

In FIG. 1, PWM 1, PWM 2, and PWM 3 may refer to the PWM drive signals that are applied to gates of power switches of three-phase inverter circuit 16. In FIG. 1, "PWM 1" may generally represent PWM drive signals for both the high side and low side switches associated with the first phase, "PWM 2" may represent PWM drive signals for both the high side and low side switches associated with the second phase, and "PWM 3" may represent PWM drive signals for both the high side and low side switches associated with the third phase.

PMW signals from processor 10 may comprise control signals from processor 10 for controlling the on-off states of the power switches in three-phase inverter circuit 16. The control signals may have similar waveforms to the drive signals for controlling gates of power switches, but with lower voltages than the actual drive signals from drivers 15. In other examples, the control signals may indicate frequencies, duty cycles, and/or gate voltages for controlling the power switches of three-phase inverter 16. Driver circuit(s) 15 may a generate PWM drive signals to be applied at gates of power switches based on the PWM control signals from processor 10.

Processor 10 may be connected to a memory (not shown in FIG. 1), which may store data used or needed by processor 10. Processor 10 may be configured to control the different power switches of three-phase inverter 16 in order to deliver phase currents to electric motor 18, e.g., via FOC control unit 12. Again, FOC control unit 12 of processor 10 may be configured to output pulse modulation signals (e.g., PWM 1, PWM 2, PWM 3) to control power switches of inverter circuit 16 to deliver a first phase current, a second phase current, and a third phase current to multi-phase electric motor 18.

Moreover, according to this disclosure, processor 10 may comprise a current calculation unit 14 configured to determine the phase currents associated with electric motor 18 without using any shunt resistor. In particular, current calculation unit 14 may be configured to determine at least one of the first, second, and third phase currents based on a first voltage drop over one of the power switches in a conducting mode and based on a temperature measurement, wherein the temperature measurement is based on a second voltage drop over a body diode of one of the power switches in a nonconducting mode during a so-called dead time. The dead time generally refers to a period of time associated with a high-side and low-side power switch when both of the power switches are caused to be nonconducting in order to ensure that cross-conductance will not occur. The dead time may comprise an intentional period of time when connected high-side and low-side power switches are controlled OFF to help to ensure that the connected high-side and low-side power switches are never conducting at the same time. For the temperature measurement, a measured second voltage drop at presumed or known current provides a measure of resistance (based on Ohm's law), and that resistance of the body diode may be dependent on temperature. In this way, the measurement of the second voltage drop over the body diode may comprise a temperature measurement, e.g., a measurement that is directly mappable to a determined temperature.

Again, the power switches within three-phase inverter circuit 16 may comprise a first high-side power switch and a first low-side power switch configured to define the first phase current, a second high-side power switch and a second low-side power switch configured to define the second phase current, and a third high-side power switch and a third low-side power switch configured to define the third phase current.

According to the example set forth above, the dead time may correspond to dead time associated with the first phase. In this case, the first voltage drop is associated with either the first high-side power switch or the first low-side power switch in a conducting mode, and the second voltage drop is associated with either the first high-side power switch or the first low-side power switch in a nonconducting mode during the dead time associated with the first phase. In this example, current calculation unit 14 of processor 10 may be configured to determine the first phase current based on the first voltage drop and the second voltage drop. Consistent with this example, current calculation unit 14 may be is further configured to: determine the second phase current based on a third voltage drop and the fourth voltage drop, wherein the third voltage drop is associated with either the second high-side power switch or the second low-side power switch in a conducting mode, and wherein the fourth voltage drop is associated with either the second high-side power switch or the second low-side power switch in a nonconducting mode during a dead time associated with the second phase. Moreover, current calculation unit 14 may be further configured to: determine the third phase current based on a fifth voltage drop and the sixth voltage drop, wherein the fifth voltage drop is associated with either the third high-side power switch or the third low-side power switch in a conducting mode, and wherein the sixth voltage drop is associated with either the third high-side power switch or the third low-side power switch in a nonconducting mode during a dead time associated with the third phase.

For the second voltage drop measurement, which may be used as a temperature measurement, the respective body diode of the power switch associated with the second voltage drop measurement experiences a free-wheeling current caused by inductance of electric motor 18. The temperature measurement can be performed by current calculation unit 14 during an instance of time when only one of the low-side power switches is nonconducting such that all of the free-wheeling current passes from ground through the body diode, which is associated with the nonconducting low-side power switch.

As described in greater detail below, to determine at least one of the phase currents, current calculation unit 14 may be configured to make three different determinations (labeled herein as "D1" "D2" and "D3"). Current calculation unit 14 may be configured to determine D1 comprising an ON resistance associated with a first power switch, which is associated with a first phase current, determine D2 comprising a junction temperature associated with the first power switch, which is associated with the first phase current, and determine D3 comprising an assumed new current level for the first phase current. Current calculation unit 14 of processor 10 may also be configured to iterate the determine D1, the determine D2, and the determine D3 for N cycles, wherein N is a positive integer greater than 2, wherein current calculation unit 14 is configured to define a final determination of the first phase current after the N cycles.

For example, to iterate the determine D1, the determine D2, and the determine D3 for N cycles, current calculation unit 14 may be configured to perform iterating calculations according to equations:

$$T = \frac{a V_B}{\ln\left(\frac{I}{I_{sat}}\right)} + b$$

$$R_{DSon} = f(T)$$

$$I = \frac{V_D}{RDSon}$$

wherein T represents the junction temperature, a represents a first predefined constant, b represents a second predefined constant, ln represents a natural logarithm function $I_{sat}$ represents a current level where saturation occurs in the first power switch, $V_B$ represents a voltage drop over the body diode of the first power switch during the dead time, $R_{DSon}$ represents a drain-to-source resistance of the first power switch in an ON state, f(T) represents a function based on T, I represents the first phase current, and $V_D$ represents the first voltage drop, which is over the first power switch.

In some examples, the iterating calculations described above may be performed automatically by current calculation unit 14 during successive pulse modulation cycles applied to the first power switch, wherein the final determination of the first phase current is defined in an Nth pulse modulation cycle, wherein N is pre-defined based on production testing. An initial assumed current level in the iterations may be estimated or pre-defined. In one example, an initial assumed current level for determining D3 can be defined based on a previous iteration process associated with a previously determined phase current defined by current calculation unit 14, which can help to initialize the initial current level to something that is closer to the final estimate than would be achieved by other assumed initial current levels. By initializing the assumed current level in this way, current calculation unit 14 may reduce the number of iterations needed to achieve an accurate determination of a given phase current. Current calculation unit 14 may be configured to know the number of iterations needed to achieve an accurate measurement of current, and the number of iterations may be based on the initial estimate. Therefore, if the initial estimate is improved (such as by using a previously calculated current for the initial estimate), the number of iterations to achieve an accurate measurement of current may be reduced. Each iteration may correspond to a PWM cycle in some examples.

In typical motor control applications, an electric motor is controlled by pulse-width-modulate signals applied power switches of an inverter circuit. The inverter circuit conventionally needs one or more external shunt resistors to measure the motor current. The shunt resistor is chosen in a way that the voltage drop is high enough to measured using and analog to digital converter. The shunt resistor sees the full motor current.

The techniques of this disclosure can provide a way to remove the external shunt resistor and to use one of the power switches (e.g., MOSFETs) in an inverter circuit as current monitor. The voltage drop across the drain-source connections of that transistor represents the motor current and can be sensed. MOSFETs in inverter circuits typically operate in the triode area. In this operating point the MOSFET behaves like a resistor. The resistor can either be looked up in the data sheet or directly measured. In this way, the technique of this disclosure may utilize a MOSFET as current monitor and by this allows a circuit designer to remove the shunt resistor entirely from motor control applications. The techniques and circuits of this disclosure may result lower costs application, less power dissipation, and in case the shunt is ground based, a better ground connection can be realized for the power MOSFETs.

Figure 2:
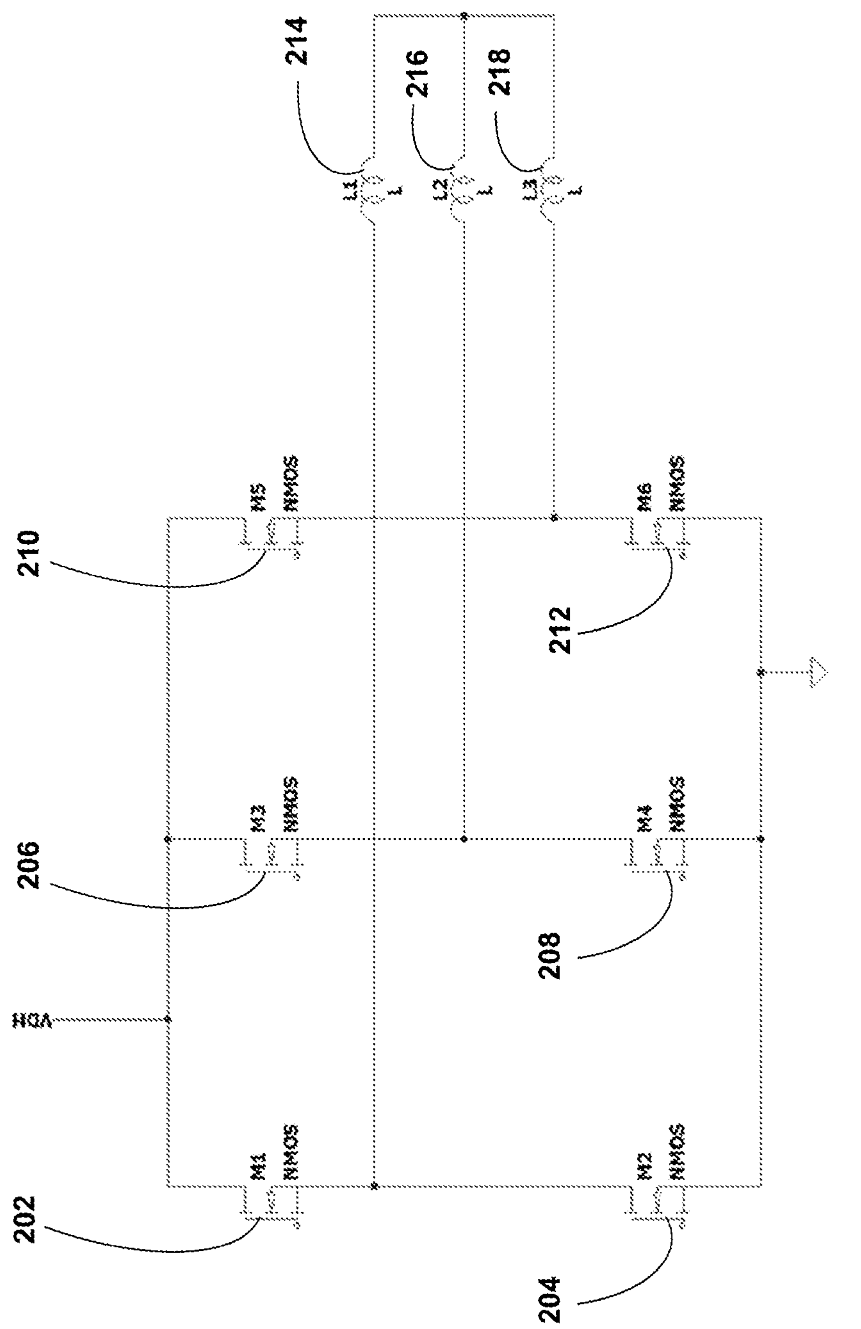
FIG. 2 is a circuit diagram showing power switches of an inverter circuit configured to control a three-phase electric motor, which is modeled by three inductor circuits.

FIG. 2 is a circuit diagram showing example power switches 202, 204, 206, 208, 210, 212 of an inverter circuit configured to control a three-phase electric motor, which is modeled by three inductor circuits. Inductors 214, 216, 218 generally model the behavior of a three-phase electric motor controlled by power switches 202, 204, 206, 208, 210, 212. A three-phase inverter circuit may comprise a first high-side power switch 202 and a first low-side power switch 204 configured to define a first phase current for a first phase of an electric motor. The three-phase inverter circuit may also comprise a second high-side power switch 206 and a second low-side power switch 208 configured to define a second phase current for a second phase of the electric motor. In addition, the three-phase inverter circuit may comprise a third high-side power switch 220 and a third low-side power switch 212 configured to define the third phase current for a third phase of electric motor. Power switches 202, 204, 206, 208, 210, 212 may comprise a simplified example of three-phase inverter circuit 16 of FIG. 1, and inductors 214, 216, 218 may generally model the behavior of electric motor 18 shown in FIG. 1. In FIG. 2, power switches 202, 204, 206, 208, 210, 212 are all labeled as NMOS transistors, which is one example of this disclosure.

Figure 3:
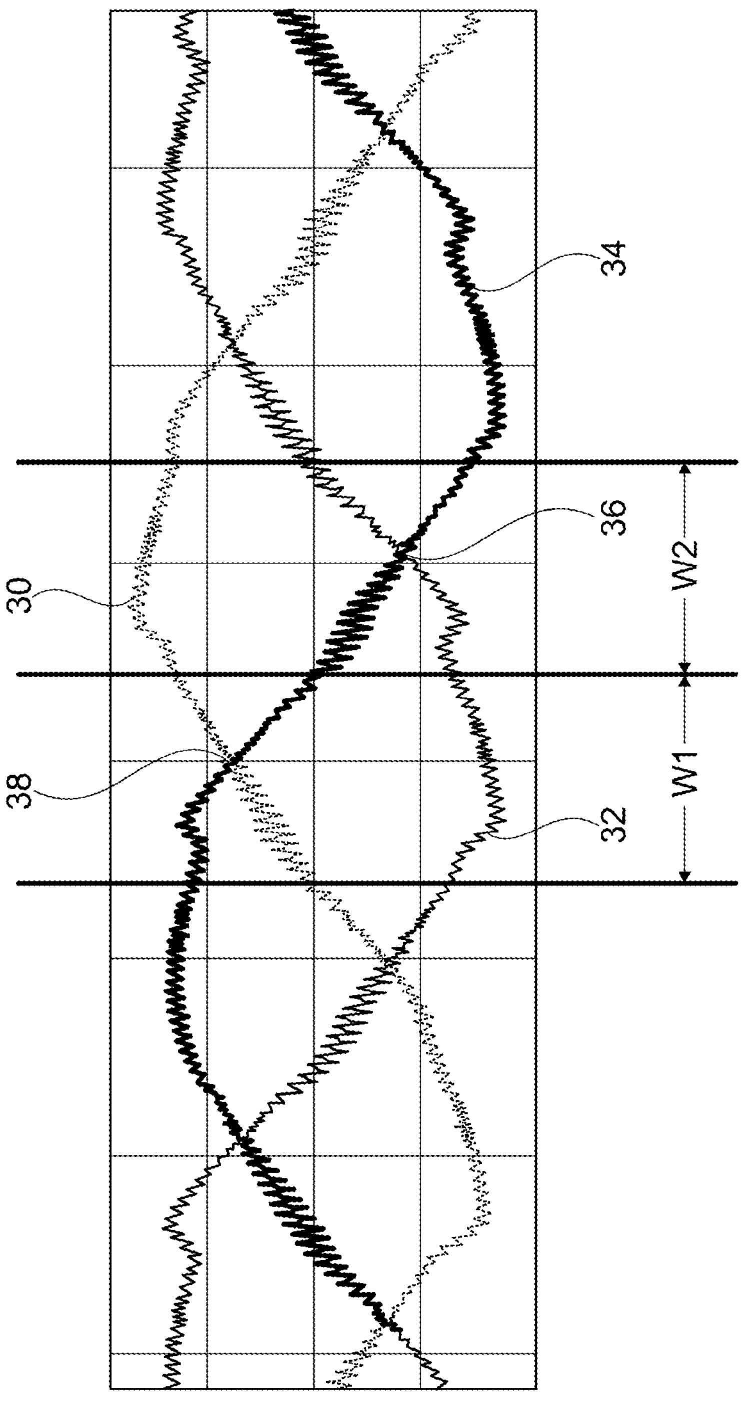
FIG. 3 is an illustration of three different waveforms of current associated with three phases of a three-phase electric motor.

FIG. 3 is an illustration of three different waveforms of current associated with three phases of a three-phase electric motor. FIG. 3 can help to illustrate some desirable timing for measuring a voltage drop over a conducting power switch, e.g., in order to determine the ON-resistance (RdsON) of that conducting power switch. Signal 30 may correspond to a first phase current signal, 32 may correspond to a second phase current, and signal 34 may correspond to a third phase current. According to this disclosure, it is desirable to measure voltage drop over a conducting power switch at a specific point in time when it is known that all of the motor current is flowing through that power switch. For a low-side switch associated first phase current associated with signal 30, this instance of time may correspond to window W2, when signal 30 is positive and signals 32, 34 are negative. In some examples, it is desirable to measure voltage drop over a conducting power switch associated with signal 30 at or near the point in time 36 when signals 32 and 34 are at a crossing point.

Similarly, for a high-side switch associated second phase current associated with signal 32, this instance of time may correspond to window W1, when signal 32 is negative and signals 30, 34 are positive. In some examples, it is desirable to measure voltage drop over a conducting power switch associated with signal 32 at or near the point in time 38 when signals 30 and 34 are at a crossing point.

One challenge with three phase systems is that in case of the free-wheeling currents, there can be 2 potential current paths through other phase current transistors. In some examples, the techniques of this disclosure solve that challenge based on analysis of the switching scheme of the PWM control. Each phase of the rotation of an electric motor, it is possible to find a switching constellation when all motor current is known to be flowing over a particular power switch (e.g., for both an RdsON measurement during a conduction phase of the power switch, and for a temperature measurement over a body diode during a nonconduction phase of the power switch). According to this disclosure, a forward voltage drop during conduction phase is measured when all motor currents are going through a given power switch. Also, according to this disclosure, a temperature measurement is performed in the inverse situation, e.g., during a dead time when all free-wheeling current is passing through a given power switch.

With these measurements for both an RdsON and a temperature for a power switch, a motor current I can be calculated iteratively from the three formulas for T (temperature), RdsON (ON-resistance) and I (motor current) according to the equations:

$$T = \frac{a V_B}{\ln\left(\frac{I}{I_{sat}}\right)} + b$$

$$R_{DSon} = f(T)$$

$$I = \frac{V_D}{RDSon}.$$

One assumption in the proposed procedure there that the current I through a transistor is the same curing both the temperature measurement over the body diode, and the forward voltage drop measurement for RdsON determination.

Figures 4, 5:
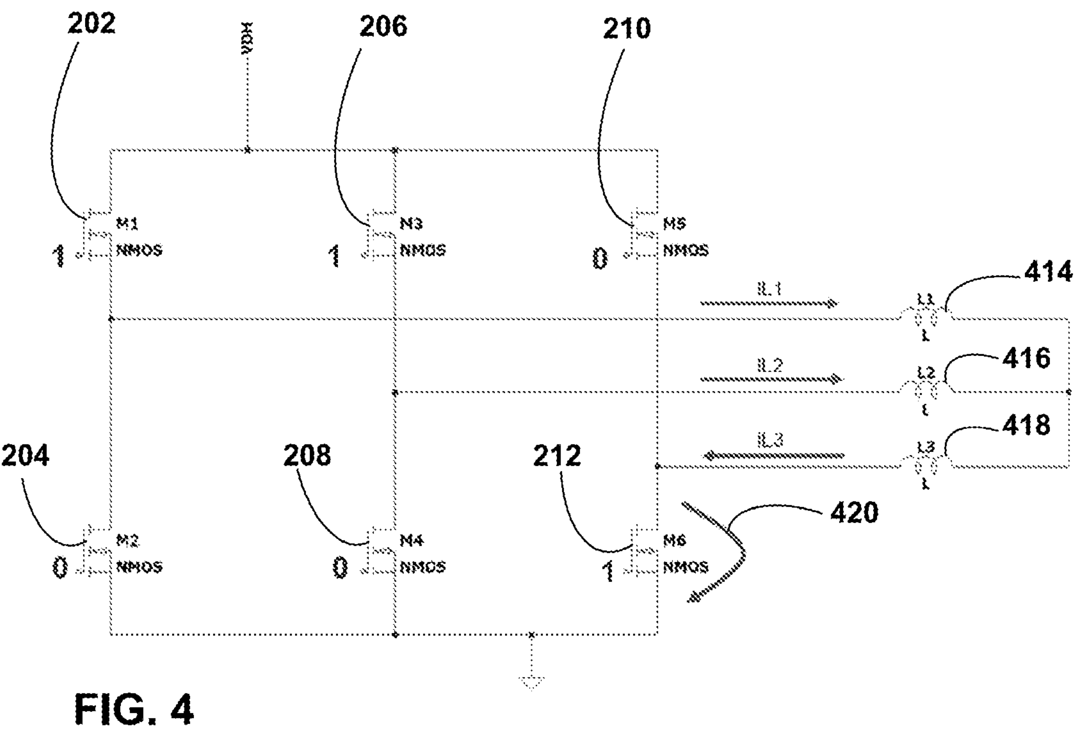
FIG. 4 is a circuit diagram showing power switches configured to control a three-phase electric motor and to measure an ON resistance associated with one of the power switches consistent with this disclosure.
FIG. 5 is a circuit diagram showing power switches configured to control a three-phase electric motor and to perform a temperature measurement consistent with this disclosure.

Any one of the power switches (e.g., power switch 202, 204, 206, 208, 210, or 212 may be used for the measurements described herein. Indeed, it is desirable in some examples to measure all three of the phase currents. Therefore, the techniques may be performed with at least one power switch (either the high-side or low-side power switch) for each phase current. FIGS. 4 and 5 illustrate measurement steps performed with regard to particular low side power switch (e.g., power switch 212). However, similar techniques can be performed using high-side power switch 206, and similar techniques may also be performed in determining other phase currents (e.g., measuring voltage drops over power switch 202 or power switch 208, and/or measuring voltage drops over power switch 204 or power switch 210).

FIG. 4 is a circuit diagram similar to FIG. 2, showing power switches configured to control a three-phase electric motor and to measure an ON resistance associated with one of the power switches consistent with this disclosure. Like FIG. 2, in FIG. 4, inductors 214, 216, 218 generally model the behavior of a three-phase electric motor, which is controlled by power switches 202, 204, 206, 208, 210, 212. Power switches 202, 204, 206, 208, 210, 212 may form part of a three-phase inverter circuit for controlling an electric motor.

As shown in FIG. 4, a voltage drop measurement 420 over low side power switch 212 is performed at a specific time when all current is flowing out of the motor, through low-side power switch 212 to ground. This occurs when low-side power switch 212 is conducting for a current branch, low side power switches 204, 208 (associated with other current branches) are not conducting, high side power switch 210 for the current branch is not conducting, and high-side power switches 202, 206 (associated with other current branches) are conducting. A similar process could alternatively (or in addition) be performed with respect to high-side power switch 210 when all motor current is flowing from VDH supply through high-side power switch 210 to the electric motor.

FIG. 5 is a circuit diagram similar to FIG. 2, showing power switches configured to control a three-phase electric motor and to perform a temperature measurement consistent with this disclosure. Like FIG. 2, in FIG. 5, inductors 514, 516, 518 generally model the behavior of a three-phase electric motor, which is controlled by power switches 202, 204, 206, 208, 210, 212. Power switches 202, 204, 206, 208, 210, 212 may form part of a three-phase inverter circuit for controlling an electric motor.

As shown in FIG. 5, a voltage drop measurement 520 over the body diode of low-side power switch 212 is performed during a nonconducting phase of low-side power switch 212 at a specific time when all free-wheeling current is flowing into the motor, from ground through low-side power switch 212. This occurs during a dead time associated with high-side power switch 210 and low side power switch 212 for a particular phase. During dead time, both high-side power switch 210 and low side power switch 212 are nonconducting. The dead time measurement of voltage drop 520 over the body diode of low-side power switch 212 (i.e., a temperature measurement) may occur when both high-side power switch 210 and low side power switch 212 are nonconducting, when low-side power switches 204, 208 for other phase currents are conducting, and when high-side power switches 202, 206 for the other phase currents are nonconducting. A similar process could alternatively (or in addition) be performed with respect to high-side power switch 210 when all inductor current (i.e., phase current) is flowing from the electric motor through the body diode of high-side power switch 210 to the supply node.

The measurements shown in FIGS. 4 and 5 may be similarly repeated with respect to other phase current, e.g., using low-side power switch 208 and low-side power switch 204 or using high-side power switch 202 and high-side power switch 206. In this way, a processor (e.g., processor 10) can be configured to identify measurements on power switches of an inverter circuit that can facilitate the ability to identify phase currents I1, I2, I3 without the need for any shut resistors.

For any given phase current, a forward voltage measurement during conduction (such as that shown in FIG. 4) may define an RdsON of a power switch, and a reverse voltage measurement over a body diode of the power switch during nonconduction (such as shown in FIG. 5) may define a temperature measurement of the power switch. For example, the forward voltage measurement during conduction at a known or presumed current level can provide the conduction resistance RdsON based on Ohm's law. In addition, the reverse voltage measurement at a known or presumed current level can provide the temperature of the body diode. In some examples, processor 10 may perform a table lookup to map the reverse voltage measurement to a temperature measurement at a presumed or defined current level.

With the measurements for both an RdsON and a temperature for a power switch, current calculation unit 14 may calculate a motor current I1, I2, or I3 iteratively from the three formulas for T (temperature), RDSon (ON-resistance) and I (motor current) as follows:

$$T = \frac{a V_B}{\ln\left(\frac{I}{I_{sat}}\right)} + b$$

$$R_{DSon} = f(T)$$

$$I = \frac{V_D}{RDSon}$$

wherein T represents the junction temperature, a represents a first predefined constant, b represents a second predefined constant, ln represents a natural logarithm function $I_{sat}$ represents a current level where saturation occurs in the first power switch, $V_B$ represents a voltage drop over the body diode of the first power switch during the dead time, $R_{DSon}$ represents a drain-to-source resistance of the first power switch in an ON state, f(T) represents a function based on T, I represents the first phase current, and $V_D$ represents the first voltage drop, which is over the first power switch.

Current calculation unit 14 may be configured to determine at least one of the first, second, and third phase currents based on a first voltage drop over one of the power switches 202, 204, 206, 208, 210, 212 in a conducting mode and based on a temperature measurement, wherein the temperature measurement is based on a second voltage drop over a body diode of one of the power switches 202, 204, 206, 208, 210, 212 in a nonconducting mode during a so-called dead time. Again, the dead time generally refers to a period of time associated with a high-side and low-side power switch when both of the power switches are caused to be nonconducting in order to ensure that cross-conductance will not occur. The dead time may comprise an intentional period of time when connected high-side and low-side power switches are controlled OFF to help to ensure that the connected high-side and low-side power switches are never conducting at the same time.

Power switches 202, 204, 206, 208, 210, 212 may be power switches of a three-phase inverter circuit 16 and may comprise a first high-side power switch 202 and a first low-side power switch 204 configured to define the first phase current, a second high-side power switch 206 and a second low-side power switch configured 208 to define the second phase current, and a third high-side power switch 210 and a third low-side power switch 212 configured to define the third phase current.

A first measured voltage drop may be associated with either the first high-side power switch 202 or the first low-side power switch 204 in a conducting mode, and the second voltage drop may be associated with either the first high-side power switch 202 or the first low-side power switch 204 in a nonconducting mode during the dead time associated with the first phase. In this example, current calculation unit 14 of processor 10 may be configured to determine the first phase current based on the first voltage drop and the second voltage drop. Consistent with this example, current calculation unit 14 may be further configured to: determine the second phase current based on a third voltage drop and the fourth voltage drop, wherein the third voltage drop is associated with either the second high-side power switch 206 or the second low-side power switch 208 in a conducting mode, and wherein the fourth voltage drop is associated with either the second high-side power switch 206 or the second low-side power switch 208 in a nonconducting mode during a dead time associated with the second phase. Moreover, current calculation unit 14 may be further configured to: determine the third phase current based on a fifth voltage drop and the sixth voltage drop, wherein the fifth voltage drop is associated with either the third high-side power switch 210 or the third low-side power switch 212 in a conducting mode, and wherein the sixth voltage drop is associated with either the third high-side power switch 210 or the third low-side power switch 212 in a nonconducting mode during a dead time associated with the third phase.

For the second voltage drop measurement, which may be used as a temperature measurement, the respective body diode of the power switch associated with the second voltage drop measurement experiences a free-wheeling current caused by inductance of electric motor 18 (modeled by inductors 214, 216, 218). The temperature measurement can be performed by current calculation unit 14 during an instance of time when only one of the low-side power switches is nonconducting such that all of the free-wheeling current passes from ground through the body diode, which is associated with the nonconducting low-side power switch, for example, such as shown above in the example of FIG. 5.

For each current branch, current calculation unit 14 may be configured to determine D1 comprising an ON resistance associated with a first power switch, which is associated with a first phase current, determine D2 comprising a junction temperature associated with the first power switch, which is associated with the first phase current, and determine D3 comprising an assumed new current level for the first phase current. Current calculation unit 14 of processor 10 may also be configured to iterate the determine D1, the determine D2, and the determine D3 for N cycles, wherein N is a positive integer greater than 2, wherein current calculation unit 14 is configured to define a final determination of the first phase current after the N cycles.

Again, to iterate the determine D1, the determine D2, and the determine D3 for N cycles, current calculation unit 14 may be configured to perform iterating calculations according to equations:

$$T = \frac{a\,V_B}{\ln\left(\frac{I}{I_{sat}}\right)} + b$$

$$R_{DSon} = f(T)$$

$$I = \frac{V_D}{RDSon}.$$

In some examples, the iterating calculations described above may be performed automatically by current calculation unit 14 during successive pulse modulation cycles applied to the first power switch, wherein the final determination of the first phase current is defined in an Nth pulse modulation cycle, wherein N is pre-defined based on production testing. An initial assumed current level in the iterations may be estimated or pre-defined. In one example, an initial assumed current level for determining D3 can be defined based on a previous iteration process associated with a previously determined phase current defined by current calculation unit 14, which can help to initialize the initial current level to something that is closer to the final estimate than would be achieved by other assumed initial current levels.

Figure 6:
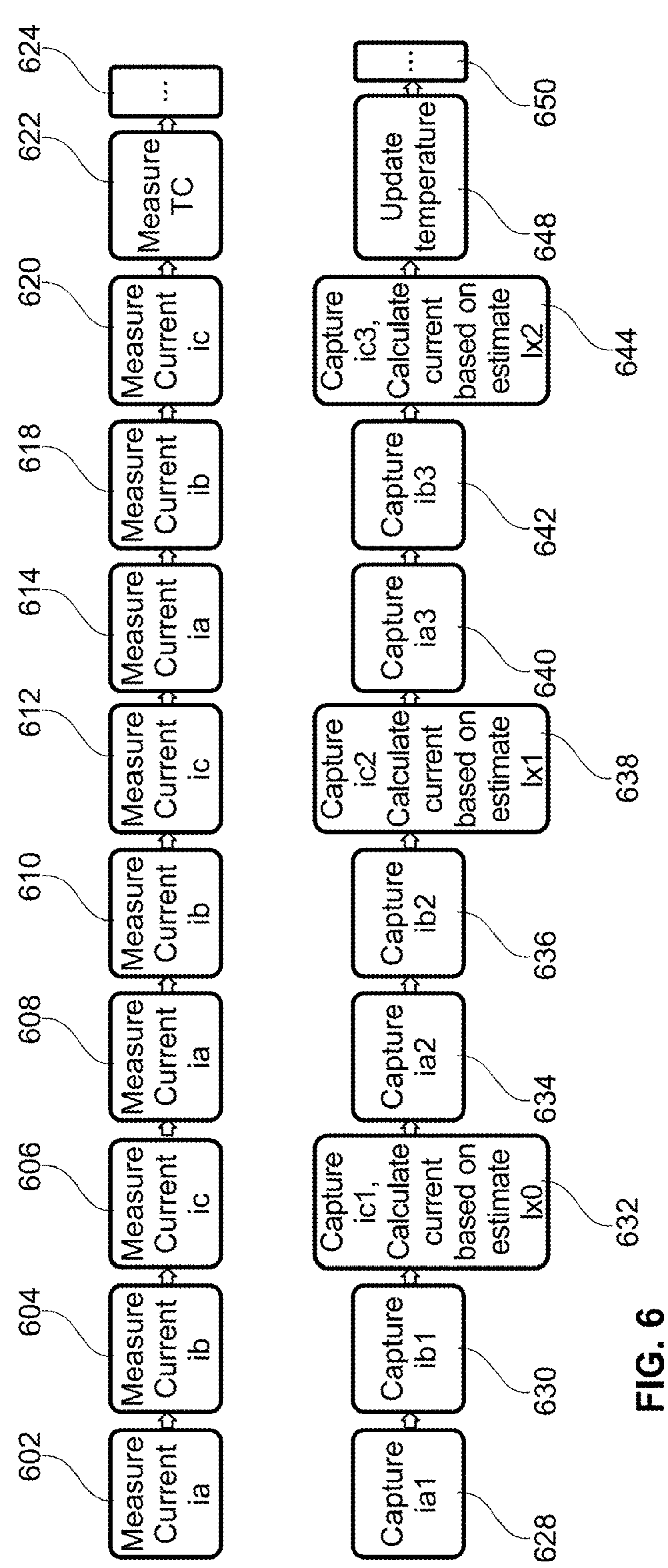
FIG. 6 is a flow diagram showing an example sequence of current measurements and temperature measurements.

FIG. 6 is a flow diagram showing an example sequence of current measurements and temperature measurements that may be performed by a current calculation unit 14 of processor 10 consistent with one or more examples of this disclosure. Measure current ic 606 refers to the current calculation that depends on the forward voltage drop measurement over a conducting power switch associated with a third phase (phase 3 or phase C). Measure current ib 606 refers to current calculation that depend on the forward voltage drop measurement over a conducting power switch associated with a second phase (phase 2 or phase B). Measure current ib 608 refers to current calculation that depends on forward voltage drop measurement over a conducting power switch associated with a first phase (phase 1 or phase A). This general process repeats for steps 610, 612, 614, 616. Once per motor revolution, a temperature measurement 622 is performed. Temperature measurement 622 may cycle from phase to phase for each successive motor revolution, e.g., generating a temperature measurement for a power switch in phase 3, then generating a temperature measurement for a power switch in phase 2 in the next motor revolution, then generating a temperature measurement for a power switch in phase 2 in the next motor revolution, then generating another temperature measurement for a power switch in phase 3, and so forth. Thus, the forward voltage measurements may have higher frequency than the reverse voltage measurements, which is due to the PWM timing of the control signals for the power switches and the availability of the necessary conditions on current flow though the power switches for such measurements. Box 624 generally represents the continuous ongoing nature of the measurements. Boxes 606, 612, 620 may correspond to the measurement shown in FIG. 4, and box 622 may correspond to the measurement shown in FIG. 5 with respect to phase current c (also called phase current 3).

Box 628 refers to the act of capturing the measurement of the forward voltage drop over a power switch associated with phase current a (phase current 1). Box 630 refers to the act of capturing the measurement of the forward voltage drop over a power switch associated with phase current b (phase current 2). Box 632 refers to the act of capturing the measurement of the forward voltage drop over a power switch associated with phase current c (phase current 1). Box 632 also refers to the process of calculating current (using the iterative calculations) based on an initial current level estimate. This initial current level estimate may be based on the previously calculated motor current, which can help accelerate the process by reducing the number of iterations needed to define the phase current based on the iterative equations set forth above. This general process repeats for steps 634, 636, 638, 640, 642, 644. Once per motor revolution, a temperature measurement 622 is performed, at which time processor 10 updates the temperature 648 determination for a particular power switch in a particular phase current path. The temperature measurement 622 may cycle from phase current path to phase current path, e.g., providing a temperature measurement for a power switch in a first phase current path, followed by a temperature measurement for a power switch in a second phase current path, followed by a temperature measurement for a power switch in a third phase current path, followed by another measurement for the power switch in the first phase current path, and so forth. In other words, in the 3-phase systems the temperature measurement can be cycled through all phases and then repeated for determining and regularly updating the temperature of any given conduction transistor.

Thus, consistent with FIG. 6, phase currents can be measured to cycle accuracy, e.g., and iterated during each power switching cycle. Temperatures can be measured at least once per rotation, and temperature for power switches in each of the three phases may be generated once for every three rotations of the electric motor. Thus, an assumption for accurate phase current determination is that a temperature gradient of power switches is slower than one mechanical rotation. If this is not the case, then other techniques for phase current measurements in the presence of a very slowly rotating motor may be desirable.

Figure 7:
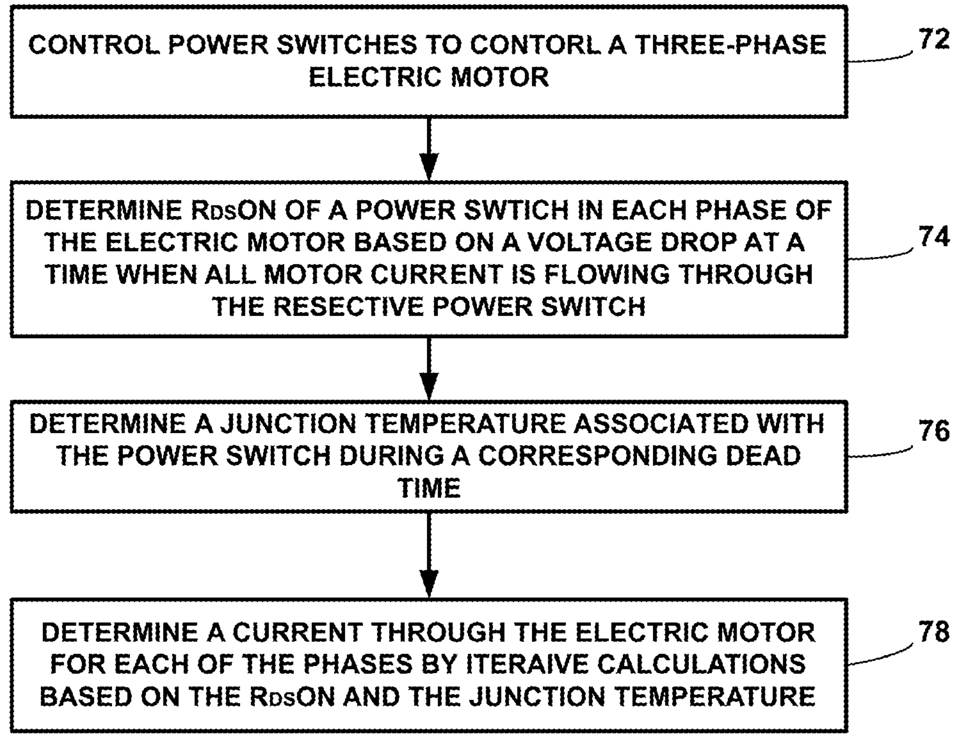
FIGS. 7 and 8 are flow diagrams of techniques that can be performed by a processor to determine current through an electric motor without using a shunt resistor.

FIG. 7 is a flow diagram of technique that can be performed by a processor (such as processor 10) to determine current through an electric motor without using a shunt resistor. As show in FIG. 7, processor 10 controls power switches of an inverter circuit 16 to control a three-phase electric motor 18. For example, FOC control unit 12 generates PWM control signals that control power switches of inverter circuit 16. In this way, processor 10 may cause inverter circuit 16 to deliver a first phase current, a second phase current, and a third phase current to three-phase electric motor 18. For each phase of electric motor 18, current calculation unit 14 determines a drain-to-source resistance (RdsON) of a power switch, i.e., either a high-side or low-side power switch, based on a voltage drop at a time when all motor current is flowing through that power switch (74). For each phase of electric motor 18, current calculation unit 14 also determines a junction temperature associated with the same respective power switch, i.e., either a high-side or low-side power switch (76). Current calculation unit 14 determines a current through the electric motor for each of the phases by iterative calculations based on the RdsON of a power switch in each phase and a junction temperature associated with the same respective power switch in each phase. In this way, current calculation unit 14 may determining the first phase current based on a first voltage drop over one of the power switches in a conducting mode and based on a temperature measurement, wherein the temperature measurement is based on a second voltage drop over a body diode of one of the power switches in a nonconducting mode during a dead time associated with the first phase.

The power switches of an inverter circuit may comprise a first high-side power switch 202 and a first low-side power switch 204 configured to define the first phase current, a second high-side power switch 206 and a second low-side power switch 208 configured to define the second phase current, and a third high-side power switch 210 and a third low-side power switch 212 configured to define the third phase current.

In some examples, the first voltage drop may be associated with either first high-side power switch 202 or first low-side power switch 204 in a conducting mode, and similarly the second voltage drop may be associated with either first high-side power switch 202 or first low-side power switch 204 in a nonconducting mode during the dead time associated with the first phase. Current calculation unit 14 may determine the first phase current based on the first voltage drop and the second voltage drop.

Consistent with FIG. 7, current calculation unit 14 determines a current through electric motor 18 for each of the phases by iterative calculations (78). Thus, consistent with the nomenclature above, current calculation unit 14 may determine a second phase current based on a third voltage drop and the fourth voltage drop, wherein the third voltage drop is associated with either second high-side power switch 206 or second low-side power switch 208 in a conducting mode, and wherein the fourth voltage drop is associated with either second high-side power switch 206 or second low-side power switch 208 in a nonconducting mode during a dead time associated with the second phase. Moreover, current calculation unit 14 may determine the third phase current based on a fifth voltage drop and the sixth voltage drop, wherein the fifth voltage drop is associated with either third high-side power switch 210 or the third low-side power switch 212 in a conducting mode, and wherein the sixth voltage drop is associated with either third high-side power switch 210 or third low-side power switch 212 in a nonconducting mode during a dead time associated with the third phase.

Figure 8:
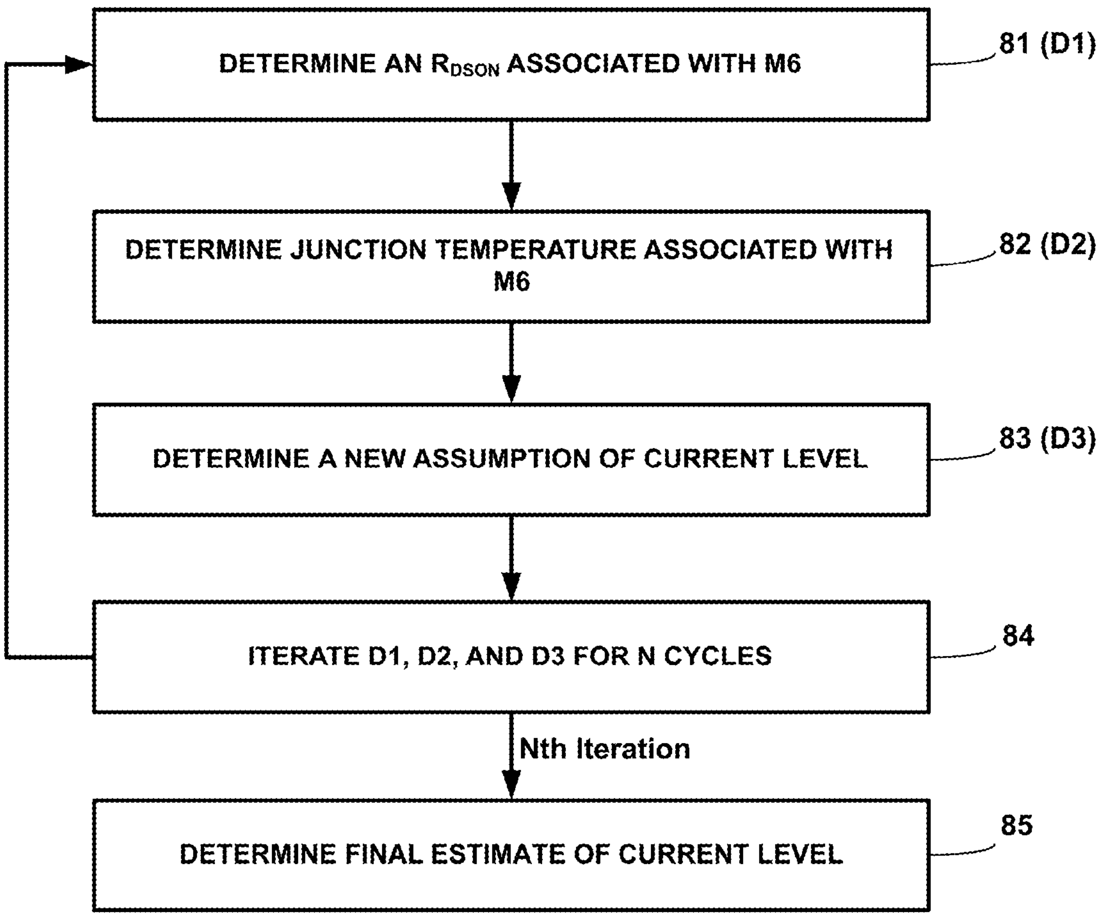

FIG. 8 is a flow diagrams of techniques that can be performed by a processor to determine a phase current through an electric motor without using a shunt resistor. In this example, low-side power switch M6 (i.e., power switch 212 of FIG. 2, 3, or 4) is used as an example to determine one of the phase currents. However a similar process may be performed using high-side power switch M5 (power switch 210) to determine that phase current. Also, a similar process can be performed using M1 or M2, and a similar process can be performed using M3 or M4, in order to iteratively calculate the other two phase currents of a three-phase electric motor.

As shown in FIG. 6, a current calculation unit 14 of processor 10 may determining at least one of the phase currents by performing the following steps. Current calculation unit 14 may determine D1 comprising an ON resistance associated M6 (81). In this example, M6 may be associated with a first phase current. Current calculation unit 14 may also determine D1 D2 comprising a junction temperature associated with M6. Current calculation unit 14 may determine D3 comprising an assumed new current level for the first phase current (83), and iterate the determining D1, the determining D2, and the determining D3 for N cycles (84), wherein N is a positive integer greater than 2. For example, current calculation unit 14 may begin with an initial estimate of current level, and then iterate towards more accurate determination of the current level. Current calculation unit 14 may determine a final estimate (a final determination) the first phase current after the N cycles. N may be pre-programmed based on device testing, and in some examples, N can may correspond to PWM control cycles. Accordingly, iterating may be performed automatically during successive pulse modulation cycles applied to power switch, wherein a final determination of the first phase current is defined in an Nth pulse modulation cycle, wherein N is pre-defined based on production testing. Also, N may be reduced for faster performance in some examples, e.g., by making an initial current estimate relatively accurate, which can be achieved by using a previously calculated phase current as the initial estimate in the iterative process. Accordingly, in some examples, an initial assumed current level for determining D3 is defined based on a previous iteration process associated with a previously determined phase current.

The techniques described in this disclosure can enable a current control loop for an electric motor, without any shunt resistor needed for determining the current through the electric motor. Processor 10 may regulate the current to electric motor 18 based on current determinations performed via the shunt-less processes described herein.

The techniques described in this disclosure may be implemented, at least in part, in circuitry, hardware, software, firmware or any combination thereof. For example, various aspects of the described techniques may be implemented within one or more logical elements, processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

It may also be possible for one or more aspects of this disclosure to be performed in software, in which case those aspects of the techniques described in this disclosure may also be embodied or encoded in a computer-readable medium, such as a computer-readable storage medium, containing instructions. Instructions embedded or encoded in a computer-readable storage medium may cause processor 10, to perform the method, e.g., when the instructions are executed. The instructions, in this example, may be stored in a memory, which may comprise random access memory (RAM), read only memory (ROM), programmable read only memory (PROM), erasable programmable read only memory (EPROM), electronically erasable programmable read only memory (EEPROM), flash memory, or other computer readable media.

The following clauses may illustrate one or more aspects of the disclosure.

Clause 1—A method comprising: controlling power switches of an inverter circuit to deliver a first phase current, a second phase current, and a third phase current to a multi-phase electric motor; and determining at least one of the first phase current, the second phase current, and the third phase current based on a first voltage drop over one of the power switches in a conducting mode and based on a temperature measurement, wherein the temperature measurement is based on a second voltage drop over a body diode of one of the power switches in a nonconducting mode during a dead time.

Clause 2—The method of clause 1, wherein the power switches comprise: a first high-side power switch and a first low-side power switch configured to define the first phase current, a second high-side power switch and a second low-side power switch configured to define the second phase current, and a third high-side power switch and a third low-side power switch configured to define the third phase current.

Clause 3—The method of clause 2, wherein the dead time is dead time associated with the first phase, wherein the first voltage drop is associated with either the first high-side power switch or the first low-side power switch in a conducting mode, and wherein the second voltage drop is associated with either the first high-side power switch or the first low-side power switch in a nonconducting mode during the dead time associated with the first phase, the method further comprising: determining the first phase current based on the first voltage drop and the second voltage drop.

Clause 4—The method of clause 3, further comprising: determining the second phase current based on a third voltage drop and a fourth voltage drop, wherein the third voltage drop is associated with either the second high-side power switch or the second low-side power switch in a conducting mode, and wherein the fourth voltage drop is associated with either the second high-side power switch or the second low-side power switch in a nonconducting mode during a dead time associated with the second phase.

Clause 5—The method of clause 4, further comprising: determining the third phase current based on a fifth voltage drop and a sixth voltage drop, wherein the fifth voltage drop is associated with either the third high-side power switch or the third low-side power switch in a conducting mode, and wherein the sixth voltage drop is associated with either the third high-side power switch or the third low-side power switch in a nonconducting mode during a dead time associated with the third phase.

Clause 6—The method of any of clauses 2-5, wherein the body diode experiences a free-wheeling current caused by inductance of the multi-phase electric motor during the dead time, and wherein the temperature measurement is performed during an instance of time when only one of the low-side power switches is nonconducting such that all of the free-wheeling current passes from ground through the body diode, which is associated with the nonconducting low-side power switch.

Clause 7—The method of any of clauses 1-6, wherein determining at least one of the first phase current, the second phase current, or the third phase current comprises: determining D1 comprising an ON resistance associated with a first power switch, which is associated with the first phase current; determining D2 comprising a junction temperature associated with the first power switch, which is associated with the first phase current; determining D3 comprising an assumed new current level for the first phase current; and iterating the determining D1, the determining D2, and the determining D3 for N cycles, wherein N is a positive integer greater than 2, wherein a final determination of the first phase current is defined after the N cycles.

Clause 8—The method of clause 7, wherein iterating the determining D1, the determining D2, and the determining D3 for N cycles comprises iterating calculations according to equations:

$$T = \frac{a V_B}{\ln\left(\frac{I}{I_{sat}}\right)} + b$$

$$R_{DSon} = f(T)$$

$$I = \frac{V_D}{RDSon}$$

wherein T represents the junction temperature, a represents a first predefined constant, b represents a second predefined constant, ln represents a natural logarithm function $I_{sat}$ represents a current level where saturation occurs in the first power switch, $V_B$ represents a voltage drop over the body diode of the first power switch during the dead time, $R_{DSon}$ represents a drain-to-source resistance of the first power switch in an ON state, f(T) represents a function based on T, I represents the first phase current, and $V_D$ represents the first voltage drop, which is over the first power switch.

Clause 9—The method of clause 7 or 8, wherein the iterating is performed automatically during successive pulse modulation cycles applied to the first power switch, wherein the final determination of the first phase current is defined in an Nth pulse modulation cycle, wherein N is pre-defined based on production testing.

Clause 10—The method of any of clauses 7-9, wherein an initial assumed current level for determining D3 is defined based on a previous iteration process associated with a previously determined phase current.

Clause 11—A processor configured to: output PM signals to control power switches of an inverter circuit to deliver a first phase current, a second phase current, and a third phase current to a multi-phase electric motor; and determine at least one of the first phase current, the second phase current, and the third phase current based on a first voltage drop over one of the power switches in a conducting mode and based on a temperature measurement, wherein the temperature measurement is based on a second voltage drop over a body diode of one of the power switches in a nonconducting mode during a dead time.

Clause 12—The processor of clause 11, wherein the power switches comprise: a first high-side power switch and a first low-side power switch configured to define the first phase current, a second high-side power switch and a second low-side power switch configured to define the second phase current, and a third high-side power switch and a third low-side power switch configured to define the third phase current.

Clause 13—The processor of clause 12, wherein the dead time is dead time associated with the first phase, wherein the first voltage drop is associated with either the first high-side power switch or the first-low side power switch in a conducting mode, and wherein the second voltage drop is associated with either the first high-side power switch or the first-low side power switch in a nonconducting mode during the dead time associated with the first phase, wherein the processor is configured to: determine the first phase current based on the first voltage drop and the second voltage drop.

Clause 14—The processor of clause 13, wherein the processor is further configured to: determine the second phase current based on a third voltage drop and a fourth voltage drop, wherein the third voltage drop is associated with either the second high-side power switch or the second low-side power switch in a conducting mode, and wherein the fourth voltage drop is associated with either the second high-side power switch or the second low-side power switch in a nonconducting mode during a dead time associated with the second phase.

Clause 15—The processor of clause 14, wherein the processor is further configured to: determine the third phase current based on a fifth voltage drop and a sixth voltage drop, wherein the fifth voltage drop is associated with either the third high-side power switch or the third low-side power switch in a conducting mode, and wherein the sixth voltage drop is associated with either the third high-side power switch or the third low-side power switch in a nonconducting mode during a dead time associated with the third phase.

Clause 16—The processor of any of clauses 12-15, wherein the body diode experiences a free-wheeling current caused by inductance of the multi-phase electric motor, and wherein the temperature measurement is performed during an instance of time when only one of the low-side power switches is nonconducting such that all of the free-wheeling current passes from ground through the body diode, which is associated with the nonconducting low-side power switch.

Clause 17—The processor of any of clauses 11-16, wherein to determine at least one of the first phase current, the second phase current, or the third phase current, the processor is configured to: determine D1 comprising an ON resistance associated with a first power switch, which is associated with the first phase current, determine D2 comprising a junction temperature associated with the first power switch, which is associated with the first phase current, determine D3 comprising an assumed new current level for the first phase current; and iterate the determine D1, the determine D2, and the determine D3 for N cycles, wherein N is a positive integer greater than 2, wherein the processor is configured to define a final determination of the first phase current after the N cycles.

Clause 18—The processor of clause 17, wherein to iterate the determine D1, the determine D2, and the determine D3 for N cycles, the processor is configured to perform iterating calculations according to equations:

$$T = \frac{a V_B}{\ln\left(\frac{I}{I_{sat}}\right)} + b$$

$$R_{DSon} = f(T)$$

$$I = \frac{V_D}{RDSon}$$

wherein T represents the junction temperature, a represents a first predefined constant, b represents a second predefined constant, ln represents a natural logarithm function $I_{sat}$ represents a current level where saturation occurs in the first power switch, $V_B$ represents a voltage drop over the body diode of the first power switch during the dead time, $R_{DSon}$ represents a drain-to-source resistance of the first power switch in an ON state, f(T) represents a function based on T, I represents the first phase current, and $V_D$ represents the first voltage drop, which is over the first power switch.

Clause 19—The processor of clause 17 or 18, wherein the iterating calculations are performed automatically during successive pulse modulation cycles applied to the first power switch, wherein the final determination of the first phase current is defined in an Nth pulse modulation cycle, wherein N is pre-defined based on production testing.

Clause 20—The processor of any of clauses 17-19, wherein an initial assumed current level for determining D3 is defined based on a previous iteration process associated with a previously determined phase current.

Clause 21—A system comprising: a three-phase electric motor; a three-phase inverter circuit comprising power switches configured to control the three-phase electric motor, wherein the power switches comprise: a first high-side power switch and a first low-side power switch configured to define a first phase current, a second high-side power switch and a second low-side power switch configured to define a second phase current, and a third high-side power switch and a third low-side power switch configured to define a third phase current; and a processor configured to output pulse modulation (PM) signals to control the power switches, wherein the processor is configured to determine at least one of the first phase current, the second phase current, and the third phase current based on a first voltage drop over a first one of the power switches in a conducting mode and based on a temperature measurement, wherein the temperature measurement is based on a second voltage drop over a body diode of the first one of the power switches in a nonconducting mode during a dead time.

Various features and aspects have been described in this disclosure. These and other features and aspects are within the scope of the following claims.

The invention claimed is:

1. A method comprising:

controlling power switches of an inverter circuit to deliver a first phase current, a second phase current, and a third phase current to a multi-phase electric motor;

determining at least one of the first phase current, the second phase current, and the third phase current based on a first voltage drop over one of the power switches in a conducting mode and based on a temperature measurement, wherein the temperature measurement is based on a second voltage drop over a body diode of one of the power switches in a nonconducting mode during a dead time; and regulating one or more of the first phase current, the second phase current, and the third phase current to the multi-phase electric motor based on the determination of at least one of the first phase current, the second phase current, and the third phase current.

2. The method of claim 1, wherein the power switches comprise:

a first high-side power switch and a first low-side power switch configured to define the first phase current, a second high-side power switch and a second low-side power switch configured to define the second phase current, and a third high-side power switch and a third low-side power switch configured to define the third phase current.

3. The method of claim 2, wherein the dead time is dead time associated with the first phase, wherein the first voltage drop is associated with either the first high-side power switch or the first low-side power switch in a conducting mode, and wherein the second voltage drop is associated with either the first high-side power switch or the first low-side power switch in a nonconducting mode during the dead time associated with the first phase, the method further comprising:

determining the first phase current based on the first voltage drop and the second voltage drop.

4. The method of claim 3, further comprising:

determining the second phase current based on a third voltage drop and a fourth voltage drop, wherein the third voltage drop is associated with either the second high-side power switch or the second low-side power switch in a conducting mode, and wherein the fourth voltage drop is associated with either the second high-side power switch or the second low-side power switch in a nonconducting mode during a dead time associated with the second phase.

5. The method of claim 4, further comprising:

determining the third phase current based on a fifth voltage drop and a sixth voltage drop, wherein the fifth voltage drop is associated with either the third high-side power switch or the third low-side power switch in a conducting mode, and wherein the sixth voltage drop is associated with either the third high-side power switch or the third low-side power switch in a nonconducting mode during a dead time associated with the third phase.

6. The method of claim 2, wherein the body diode experiences a free-wheeling current caused by inductance of the multi-phase electric motor during the dead time, and wherein the temperature measurement is performed during an instance of time when only one of the low-side power switches is nonconducting such that all of the free-wheeling current passes from ground through the body diode, which is associated with the nonconducting low-side power switch.

7. The method of claim 1, wherein determining at least one of the first phase current, the second phase current, or the third phase current comprises:

determining D1 comprising an ON resistance associated with a first power switch, which is associated with the first phase current;

determining D2 comprising a junction temperature associated with the first power switch, which is associated with the first phase current;

determining D3 comprising an assumed new current level for the first phase current; and iterating the determining D1, the determining D2, and the determining D3 for N cycles, wherein Nis a positive integer greater than 2, wherein a final determination of the first phase current is defined after the N cycles.

8. The method of claim 7, wherein iterating the determining D1, the determining D2, and the determining D3 for N cycles comprises iterating calculations according to equations:

$$T = \frac{aV_B}{\ln\left(\frac{I}{I_{sat}}\right)} + b$$

$$R_{DSon} = f(T)$$

$$I = \frac{V_D}{RDSon}$$

wherein

T represents the junction temperature, a represents a first predefined constant, b represents a second predefined constant, ln represents a natural logarithm function, $I_{sat}$ represents a current level where saturation occurs in the first power switch, $V_B$ represents a voltage drop over the body diode of the first power switch during the dead time, $R_{DSon}$ represents a drain-to-source resistance of the first power switch in an ON state, f(T) represents a function based on T, I represents the first phase current, and $V_D$ represents the first voltage drop, which is over the first power switch.

9. The method of claim 7, wherein the iterating is performed automatically during successive pulse modulation cycles applied to the first power switch, wherein the final determination of the first phase current is defined in an Nth pulse modulation cycle, wherein Nis pre-defined based on production testing.

10. The method of claim 7, wherein an initial assumed current level for determining D3 is defined based on a previous iteration process associated with a previously determined phase current.

11. A processor configured to:

output pulse modulation (PM) signals to control power switches of an inverter circuit to deliver a first phase current, a second phase current, and a third phase current to a multi-phase electric motor;

determine at least one of the first phase current, the second phase current, and the third phase current based on a first voltage drop over one of the power switches in a conducting mode and based on a temperature measurement, wherein the temperature measurement is based on a second voltage drop over a body diode of one of the power switches in a nonconducting mode during a dead time; and regulate one or more of the first phase current, the second phase current, and the third phase current to the multi-phase electric motor based on the determination of at least one of the first phase current, the second phase current, and the third phase current.

12. The processor of claim 11, wherein the power switches comprise:

a first high-side power switch and a first low-side power switch configured to define the first phase current, a second high-side power switch and a second low-side power switch configured to define the second phase current, and a third high-side power switch and a third low-side power switch configured to define the third phase current.

13. The processor of claim 12, wherein the dead time is dead time associated with the first phase, wherein the first voltage drop is associated with either the first high-side power switch or the first low-side power switch in a conducting mode, and wherein the second voltage drop is associated with either the first high-side power switch or the first low-side power switch in a nonconducting mode during the dead time associated with the first phase, wherein the processor is configured to:

determine the first phase current based on the first voltage drop and the second voltage drop.

14. The processor of claim 13, wherein the processor is further configured to:

determine the second phase current based on a third voltage drop and a fourth voltage drop, wherein the third voltage drop is associated with either the second high-side power switch or the second low-side power switch in a conducting mode, and wherein the fourth voltage drop is associated with either the second high-side power switch or the second low-side power switch in a nonconducting mode during a dead time associated with the second phase.

15. The processor of claim 14, wherein the processor is further configured to:

determine the third phase current based on a fifth voltage drop and a sixth voltage drop, wherein the fifth voltage drop is associated with either the third high-side power switch or the third low-side power switch in a conducting mode, and wherein the sixth voltage drop is associated with either the third high-side power switch or the third low-side power switch in a nonconducting mode during a dead time associated with the third phase.

16. The processor of claim 12, wherein the body diode experiences a free-wheeling current caused by inductance of the multi-phase electric motor, and wherein the temperature measurement is performed during an instance of time when only one of the low-side power switches is nonconducting such that all of the free-wheeling current passes from ground through the body diode, which is associated with the nonconducting low-side power switch.

17. The processor of claim 11, wherein to determine at least one of the first phase current, the second phase current, or the third phase current, the processor is configured to:

determine D1 comprising an ON resistance associated with a first power switch, which is associated with the first phase current;

determine D2 comprising a junction temperature associated with the first power switch, which is associated with the first phase current;

determine D3 comprising an assumed new current level for the first phase current; and iterate the determine D1, the determine D2, and the determine D3 for N cycles, wherein N is a positive integer greater than 2, wherein the processor is configured to define a final determination of the first phase current after the N cycles.

18. The processor of claim 17, wherein to iterate the determine D1, the determine D2, and the determine D3 for N cycles, the processor is configured to perform iterating calculations according to equations:

$$T = \frac{aV_B}{\ln\left(\frac{I}{I_{sat}}\right)} + b$$

$$R_{DSon} = f(T)$$

$$I = \frac{V_D}{RDSon}$$

wherein

T represents the junction temperature, a represents a first predefined constant, b represents a second predefined constant, ln represents a natural logarithm function, $I_{sat}$ represents a current level where saturation occurs in the first power switch, $V_B$ represents a voltage drop over the body diode of the first power switch during the dead time, $R_{DSon}$ represents a drain-to-source resistance of the first power switch in an ON state, f(T) represents a function based on T, I represents the first phase current, and $V_D$ represents the first voltage drop, which is over the first power switch.

19. The processor of claim 17, wherein the iterating determinations are performed automatically during successive pulse modulation cycles applied to the first power switch, wherein the final determination of the first phase current is defined in an Nth pulse modulation cycle, wherein N is pre-defined based on production testing.

20. The processor of claim 17, wherein an initial assumed current level for determining D3 is defined based on a previous iteration process associated with a previously determined phase current.

21. A system comprising:

a three-phase electric motor;

a three-phase inverter circuit comprising power switches configured to control the three-phase electric motor, wherein the power switches comprise:

a first high-side power switch and a first low-side power switch configured to define a first phase current, a second high-side power switch and a second low-side power switch configured to define a second phase current, and a third high-side power switch and a third low-side power switch configured to define a third phase current; and a processor configured to output pulse modulation (PM) signals to control the power switches, wherein the processor is configured to determine at least one of the first phase current, the second phase current, and the third phase current based on a first voltage drop over a first one of the power switches in a conducting mode and based on a temperature measurement, wherein the temperature measurement is based on a second voltage drop over a body diode of the first one of the power switches in a nonconducting mode during a dead time.

* * * * *